United States Patent [19]

Meguro

[11] 4,285,116
[45] Aug. 25, 1981

[54] METHOD OF MANUFACTURING HIGH VOLTAGE MIS TYPE SEMICONDUCTOR DEVICE

[75] Inventor: Satoshi Meguro, Kodaira, Japan

[73] Assignee: Hitachi, Ltd., Tokyo, Japan

[21] Appl. No.: 1,312

[22] Filed: Jan. 5, 1979

Related U.S. Application Data

[62] Division of Ser. No. 791,184, Apr. 27, 1977, abandoned.

[30] Foreign Application Priority Data

Apr. 28, 1976 [JP] Japan ................... 51-47698

[51] Int. Cl.³ .................. H01L 21/265; H01L 29/78
[52] U.S. Cl. .................................. 29/571; 29/576 B;
148/1.5; 148/187; 357/23
[58] Field of Search ................ 29/571, 578, 576 B;
148/1.5, 187; 357/23

[56] References Cited

U.S. PATENT DOCUMENTS

| | | | |
|---|---|---|---|
| 3,679,492 | 7/1972 | Fang et al. | 357/23 |
| 3,745,425 | 7/1973 | Beale et al. | 357/235 R |
| 3,806,371 | 4/1974 | Barone | 357/42 |
| 3,983,572 | 9/1976 | Johnson | 357/23 |
| 4,013,484 | 3/1977 | Boleky et al. | 148/1.5 |
| 4,023,195 | 5/1977 | Richman | 357/23 |
| 4,033,026 | 7/1977 | Pashley | 29/571 |
| 4,043,848 | 8/1977 | Bazin | 148/187 |

OTHER PUBLICATIONS

Chang et al., "High Voltage FET Integrated Circuit Process", IBM-TDB, 16 (Oct. 1973) 1635–1636.

*Primary Examiner*—Upendra Roy
*Attorney, Agent, or Firm*—Craig and Antonelli

[57] ABSTRACT

Disclosed is a MIS type semiconductor device in which a source and a drain layer are selectively formed in a surface of a semiconductor substrate while a gate electrode is formed over a channel region between the source layer and the drain layer in the substrate surface through an interposed gate insulating film, wherein the semiconductor substrate is formed with selectively buried insulation films between the source and drain layers and the channel portion in thickness greater than that of the gate insulating film and further under the selected insulating films formed with a first region of the same conduction type as that of the source layer insulating for connecting the channel portion and the source layer to each other and with a second region of the same conduction type as that of the drain layer for connecting the drain layer and the channel portion to each other, the second region having an impurity concentration greater than that of the drain region, and the gate electrode is formed as extending over the selected insulating films. The second region underlying the selectively buried thick film functions as a saturatable resistance element to increase the voltage which the device can withstand. The channel length is unvariably determined by the distance between the first and the second region. No dielectric breakdown will occur at the end portions of the gate electrode extending over the selective insulating films.

20 Claims, 10 Drawing Figures

METHOD OF MANUFACTURING HIGH VOLTAGE MIS TYPE SEMICONDUCTOR DEVICE

This is a division of application Ser. No. 791,184 filed Apr. 27, 1977, abandoned.

The present invention relates to a MIS type semiconductor device (MIS type transistor) having a high breakdown voltage and a method of manufacturing the same.

In the first place, a brief description will be made on the accompanying drawings which will be helpful for a better understanding of the MIS type semiconductor device according to the invention as compared with those proposed heretofore. In the drawings, FIG. 1 shows a structure of a MIS type transistor in a sectional view to illustrate the teaching of the invention;

Figure 1:
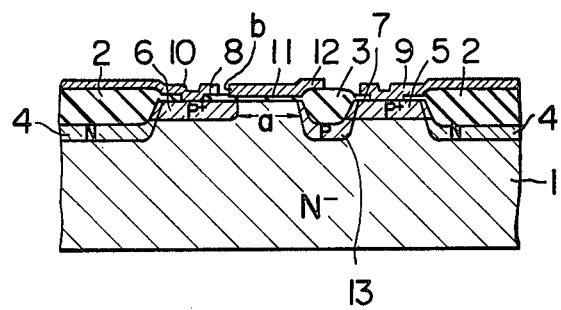

The inventors of the present application have already proposed a structure of a MIS type semiconductor device of a high integration density for a high performance which has a high breakdown voltage in Japanese patent application No. 11460/1976, filed on Feb. 6, 1976. An example of such device is shown in FIG. 1 in a sectional view. Referring to the figure, reference numeral 1 designates an N⁻ type semiconductor substrate having a surface in which oxide films 2 and 3 are formed through a selective oxidizing process so as to enclose a region where the transistor is to be formed and at the same time to isolate a source region and a channel region from each other. Formed under the oxide film 2 (known as field oxide film) is an N type semiconductor layer 4 which has an impurity concentration greater than that of the N⁻ type semiconductor substrate 1 and serves to prevent the occurrence of parasitic MOS effect. In this case, this parasitic MOS effect may occur as follows. With negative voltage applied to the lead on the field oxide film, this negative voltage converts the surface of the N⁻ type semiconductor substrate surface below the field oxide film 2 to P conduction type. This converted surface serves as a drain or source layer while the field oxide film between such source and drain regions serves as a gate oxide with the resultant MOS effect.

The drain and source regions are doped with a P+ type impurity thereby to form a drain layer 5 and a source layer 6, respectively. The drain and the source layers 5 and 6 are formed with oxide films 7 and 8 on the respective surfaces thereof and connected to a drain electrode 9 and a source electrode 10, respectively, through associated contacting apertures formed in the oxide films 7 and 8. A gate electrode 12 of an electrically conductive polycrystalline silicon layer is formed on the channel region through an interposed gate oxide film 11 with one edge portion of the gate electrode extending partially over the oxide film 3. Formed under the oxide film 3 is a P type semiconductor layer 13 which is connected to the drain layer 5 and has an impurity concentration smaller than that of the latter, whereby the avalanche breakdown possibly caused between the drain layer and the N+ type semiconductor substrate with a high voltage applied to the drain layer is prevented to assure high breakdown voltage.

With such structure of the high voltage-rated MIS semiconductor device, it has however been found that dielectric breakdown of the gate insulating film will occur concentrically at the peripheral portion b of the gate electrode located adjacent to the source layer 6, when a surge voltage is applied to the gate electrode of polycrystalline silicon or drain electrode. Such destruction of the gate isolating film at the peripheral portion will occur even when a gate protecting element such as a diode and/or a resistor connected to the gate electrode (not shown) is provided. It is believed that such undesirable phenomenon is ascribable to the fact that the electric field is likely to be concentrated at the peripheral portion of the gate electrode and the gate insulating film therearound is extremely thin.

In this connection, it is also noted that the formation of the source layer 6 is effected through an ion implantation or diffusion process by using the polycrystalline silicon layer of the gate electrode 12 as a mask. For this reason, the channel length a is determined by the width of the gate electrode 12. In practice, the width of the gate electrode 12 can be realized with a high accuracy. However, dimensional deviation on the order of $\pm 2$ $\mu$m will often occur in the mask alignment prior to the formation of the gate electrode 12. Such deviation of course provides a cause for variations in the channel length a because at least the source region is formed through diffusion or ion implantation technic by using the gate electrode as the mask therefor.

Accordingly, an object of the invention is to provide a MIS type semiconductor device having a high breakdown voltage which is immune to the destruction of the gate insulating film.

Another object of the invention is to provide a method of manufacturing the same.

With the above objects in view, there is provided according to a fundamental aspect of the invention a MIS type semiconductor device in which a source and a drain layer are selectively formed in a surface of a semiconductor substrate while a gate electrode is formed over a channel region between the source layer and the drain layer in the substrate surface through an interposed gate insulating film, wherein the semiconductor substrate is formed with selectively buried insulation films between the source and drain layers and the channel portion in thickness greater than that of the gate insulating film and further under the selected insulating films formed with a first region of the same conduction type as that of the source layer for connecting the channel portion and the source layer to each other and with a second region of the same conduction type as that of the drain layer for connecting the drain layer and the channel portion to each other, the second region having an impurity concentration greater than that of the drain region, and the gate electrode is formed as extending over the selected insulating films.

Now, detailed description will be made on preferred embodiments of MIS type semiconductor device according to the invention.

Figure 2:
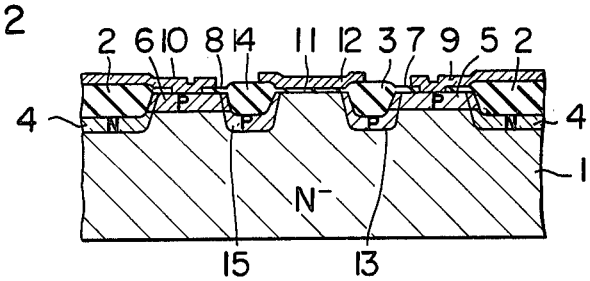
FIG. 2 is a sectional view of an embodiment of the MIS type transistor constructed in accordance with the teaching of the invention.

FIG. 2 shows an embodiment of MIS type semiconductor device according to the invention in a sectional view. The structure shown in FIG. 2 differs from the one shown in FIG. 1 in that a buried thick oxide film 14 is formed at the side of the source region in a similar manner as the drain region side and additionally a P type semiconductor layer 15 is formed in the semiconductor substrate under the oxide film 14 for connecting the source layer 6 to the channel region lying immediately below the gate insulating oxide film 11.

In the following, an example of the method of manufacturing the MIS semiconductor device of the above structure will be described by referring to FIGS. 3a to 3e.

Figure 3A:
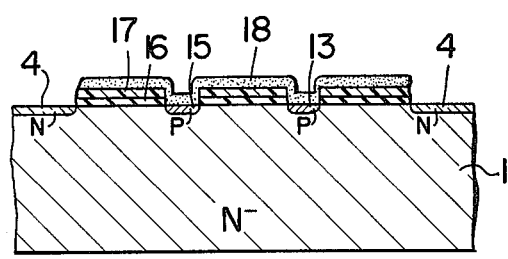
FIGS. 3a to 3e show sections of a MIS transistor at manufacturing steps to illustrate an example of the manufacturing method according to the invention.

Referring to FIG. 3a, at first, a thermally oxidized film 16 ($SiO_2$) having a thickness of 800 Å is formed in the plane (100) on a surface of a $N^-$ type substrate (Si) having resistivity of 2 Ω-cm. Further, a nitride ($Si_3N_4$) film 17 is formed on the $SiO_2$ film 16 in thickness of 1400 Å. This nitride film is obtained from reaction: $4NH_3 + 3SiH_4 \rightarrow Si_3N_4 + 12H_2$. A photoresist film of 8500 Å thick is formed on the nitride film 17 and subjected to a photoresist treatment comprising selective exposure and etching steps. Subsequently, the nitride film 17 as well as the thermally oxidized film 16 are selectively etched by using the thus formed photoresist film as the mask for the etching treatment, thereby to form apertures for forming P type semiconductor regions 13 and 15 and expose the corresponding surface regions of the semiconductor substrate 1. The etching treatment of the nitride film may be effected through a plasma etching process. Subsequently, the exposed surface of the substrate 1 is implanted with boron ions at the rate of about $2 \times 10^-$ atoms/cm$^2$ with the photoresist film being left as it is, whereby the P type regions 13 and 15 are formed. Then, the photoresist film is removed and a new photoresist film 18 is formed and subjected to a photoresist treatment in a similar manner as the removed photoresist layer. The nitride film ($Si_3N_4$) 17 and the thermally oxidized film ($SiO_2$) are selectively etched away by using the photoresist film 18 as the mask therefor, thereby to form an opening for the formation of an N type semiconductor layer 4 to surround the P type semiconductor regions 13 and 15 and expose the associated surface portion of the substrate 1. The thus exposed surface of the semiconductor substrate 1 is implanted with phosphor ions at the rate of about $2 \times 10^{12}$ atoms/cm$^2$ thereby to form the N type semiconductor layer 4. FIG. 3a shows the structure of the MIS semiconductor device at the step where the N type semiconductor layer 4 has just been formed.

Figure 3B:
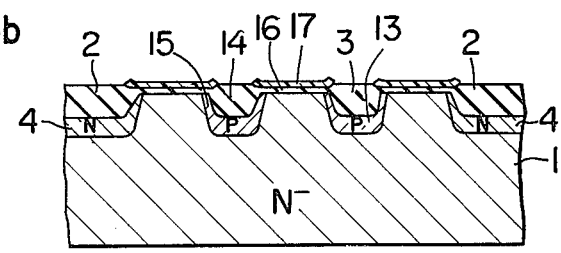

Referring to FIG. 3b, the photoresist film 18 is removed and the surfaces of P type semiconductor regions 13 and 15 as well as N type layer 4 are selectively oxidized with $SiO_2$ film 16 and $Si_3N_4$ film 17 being used as the mask for the selective oxidation, which may be conducted at 1000° C. for 6 to 7 hours in the atmosphere of mixed oxygen and nitrogen. As a result of the oxidation step, buried thick oxide ($SiO_2$) films 2, 3 and 14 of about 1.2μ thick are formed. It will be noted that the N type semiconductor layer 4 and the P type semiconductor regions 13 and 15 having surface impurity concentration of about $10^{16} - 10^{17}$ atoms/cm$^2$ are located immediately below the $SiO_2$ films 2, 3 and 14.

Figure 3C:
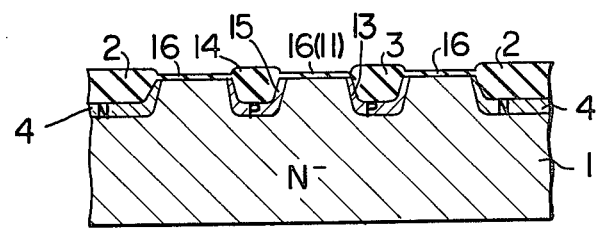

At the step shown in FIG. 3c, the $Si_3N_4$ film 17 is removed through chemical etching using $H_3PO_4$ aqueous solution, at 175° C. with the etching rate of 50 Å/min. or plasma etching, $SiO_2$ film 16 remaining as it is. It is to be noted that a portion of $SiO_2$ film 16 constitutes the gate insulating oxide film of the MIS transistor. Alternatively, the $SiO_2$ film 16 is also removed and a fresh thermally oxidized film ($SiO_2$ film) may be formed to be used as the oxide film for the gate.

Figure 3D:
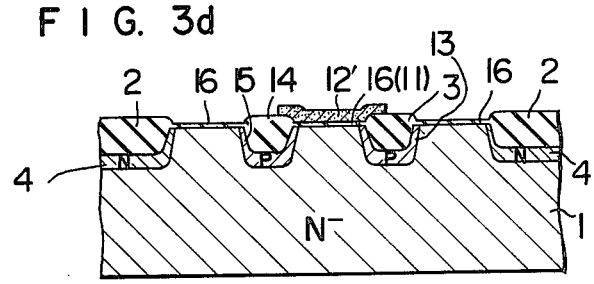

At the step illustrated in FIG. 3d, the whole surface of the semiconductor substrate 1 having the structure shown in FIG. 3c is formed with a polycrystalline silicon layer 12' of 3500 Å thick at temperature of 600° C. in the atmosphere of mixed nitrogen and silane ($SiH_4$). Subsequently, the polycrystalline silicon layer 12' is removed through a selective etching treatment by using a photoresist layer formed thereon as the etching mask. The remaining polycrystalline silicon layer 12' is used for a gate electrode 12 as well as for a wiring or metallization layer (not shown). The polycrystalline silicon layer 12' destined to constitute the gate electrode is so selectively etched that end portions thereof extend over the buried thick oxide ($SiO_2$) layers 3 and 14, as is shown in FIG. 3d.

Figure 3E:
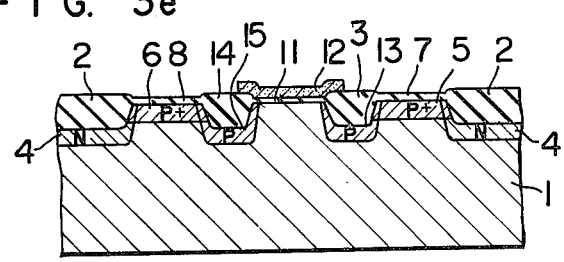

At the step shown in FIG. 3e, the oxide film ($SiO_2$) 16 is removed away without using a photoresist film and openings are formed to provide contact regions for leading-out electrodes for the source and the drain layer. The reason why the photoresist layer is not used at this step can be explained by the fact that the oxide ($SiO_2$) films 2, 3 and 14 are remarkably thicker than the oxide film 16 and therefore the oxide films 2, 3 and 14 may remain with a sufficient thickness even after the oxide film 16 have been etched away to expose the surface of the semiconductor substrate 1. Next, P type impurity, say boron, is diffused into the $N^-$ type substrate 1 at 1050° C. for about 30 minutes to form a $P^+$ type drain layer and a $P^+$ type source layer having a surface impurity concentration of $10^{20}$ atoms/cm$^2$ in the $N^-$ type semiconductor substrate 1 using $SiO_2$ films 2, 3 and 14 as masks. As a result of such diffusion step, the drain and the source layer 5 and 6 are formed with thermally oxidized ($SiO_2$) films 7 and 8 at the respective surfaces thereof. Further, the polycrystalline silicon layer 12' contains P type impurity to exhibit a low resistivity. Accordingly, the layer 12' can be used as the gate electrode 12.

Next, the $SiO_2$ films 7 and 8 are selectively removed through etching treatment and formed with contact openings at appropriate portions thereof. Subsequently, the whole surface is formed with an aluminum layer through evaporation, which is thereafter etched away selectively through photoresist treatment, whereby the drain electrode as well as the source electrode 10 connected to the drain layer 5 and the source layer 6, respectively, are formed as is shown in FIG. 2. The removal of the $SiO_2$ films 7 and 8 through the etching treatment can be carried out without using the photoresist film by taking advantage of the relation in thickness of the $SiO_2$ films 2, 3, 14 and 7, 8, as described hereinbefore.

Figure 4:
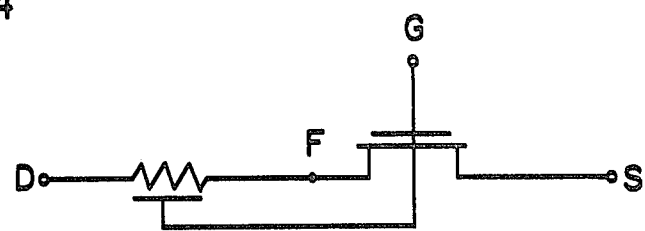
FIG. 4 is a circuit diagram of a MIS transistor.

With the structure of the MIS semiconductor device described above, the aimed object of the invention can be accomplished for the following reasons:

(1) By virtue of such structure that a thick selectively buried oxide ($SiO_2$) film 3 is provided between the $P^+$ type drain layer 5 and the channel portion (i.e. the surface portion of the semiconductor substrate 1 underlying immediately below the gate oxide film 12) and that the P type semiconductor region 13 is provided which has an impurity concentration lower than that of the drain layer to serve to connect the drain layer 5 and the channel portion, the P type semiconductor region 13 can function as a resistance in the drain layer 5. In other words, MIS transistor of the structure described above has an electrical structure such as shown in the equivalent circuit diagram of FIG. 4. The P type semiconductor region 13 will serve as a saturatable resistance element, as a result of which the voltage applied to the drain electrode D will be held at a level lower than the pinch-off voltage of such saturatable resistance at the point F. In this manner, the voltage rated for the drain layer 5 can be set at a higher level than the surface breakdown voltage across the cylindrical PN junction between the drain layer 5 and the semiconductor substrate 1 and increased approximately upto the breakdown voltage of the planar PN junction between the drain layer 5 and the substrate 1. Thus, the MIS semiconductor device according to the invention can handle a significantly high voltage.

(2) Since the peripheral edge portions of the gate electrode 12 made of polycrystalline silicon layer extend partially over the buried oxide ($SiO_2$) films 3 and 14, possibility of the gate insulating film being destroyed at the edge portions of the gate electrode 12 is positively suppressed.

(3) The channel length is determined by the distance between the P type semiconductor regions 13 and 15 before the formation of the polycrystalline silicon gate electrode 12, while the distance in turn is determined by the mask pattern as used as well as the conditions such as temperature and time duration required for forming the buried oxide films. Thus, variations in the above distance due to deviation in the mask alignment upon forming the gate electrode can be utterly excluded. In other words, although the polycrystalline silicon layer destined to constitute the gate electrode is used as the diffusion mask (formed by self-alignment) for the formation of the source and drain layers, the channel length between the source and the drain is determined before the gate electrode is formed. Accordingly, even when deviation on the order of $\pm 2$ $\mu$m should occur in the position of the gate electrode 12 at the formation thereof due to a misalignment of the mask, no influence is exerted onto the channel length. Thus, the channel length can be positively set.

Figure 5:
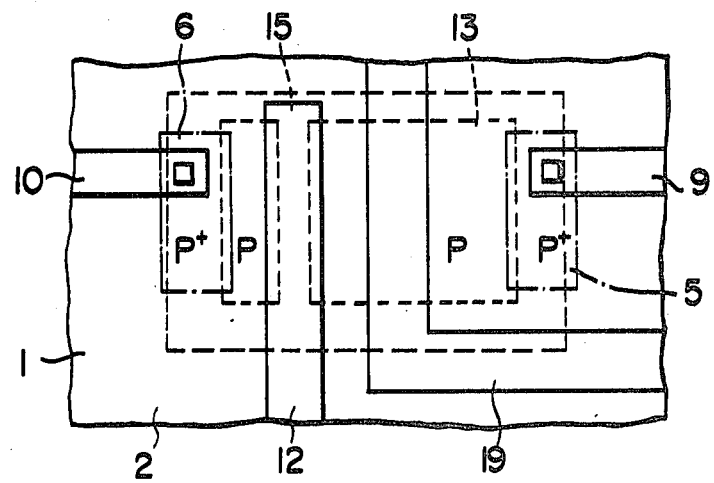
FIG. 5 is a plan view showing an embodiment of MIS transistor according to the invention.

(4) Since the P type semiconductor regions 13 and 15 are subjected to the further diffusion treatment for a sufficiently lengthened time when these regions 13 and 15 are selectively oxidized, no lengthened diffusion will take place upon formation of the drain and source layers 5 and 6 through diffusion. Namely, the semiconductor substrate undergoes the treatment for selectively forming the selective oxide films for 6 to 7 hours at a temperature of 1000° C. In contrast thereto, the time duration required for forming the drain and the source layer 5 and 6 through diffusion at 1050° C. is only on the order of only 30 minutes. Thus, the channel length is fixed at the termination of the selective oxidation treatment and held at the fixed length without being changed in the succeeding processes. It is also noted that evaporation of aluminium for the electrodes or wiring is carried out at the substrate temperature on the order of 300° C. In this connection, when the wiring layer (polycrystalline silicon layer) is deposited on the upper surfaces of the oxide films 3 and 14 in perpendicular to the plane of the drawing, flexibility is allowed in the design of the wiring or metallization, involving an enhanced integration density. For example, the polycrystalline layer 19 may be so deposited as to extend over the selectively oxidized film 3 on the P type semiconductor region 13, as is shown in FIG. 5.

Figure 6:
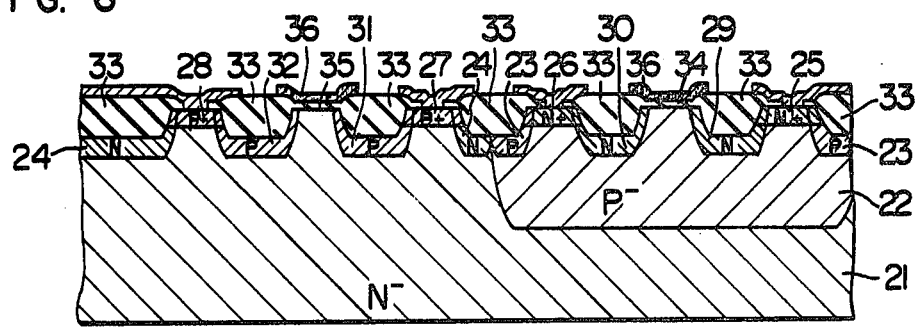
FIG. 6 is a sectional view of an embodiment of a complementary type MIS semiconductor integrated circuit device to which the teaching of the invention is applied.

FIG. 6 shows a complementary type MIS semiconductor integrated circuit which can be constructed by implementing therein MIS semiconductor devices according to the invention. In the figure, reference numeral 21 denotes an N− semiconductor substrate, 22 a P− type well region, 23 a P type semiconductor layer imparted with an impurity concentration higher than that of the P− type well region with a view to preventing a parasitic MOS structure from being formed, 24 an N type semiconductor layer having a higher impurity concentration than the substrate 21 for the just above mentioned reason, 25 and 26 designate, respectively, a drain and a source layer of an N channel MIS (MOS), 27 and 28 denote a drain and source layer of a P channel MIS (MOS), respectively, 29 and 30 denote N type semiconductor regions each having a lower impurity concentration than the drain and source layers 25 and 26, 31 and 32 P type semiconductor regions each having a lower impurity concentration than the drain and the source layer 27 and 28, 33 denotes a selectively buried oxide ($SiO_2$) film, 34 and 35 denote gate oxide films and numeral 36 denotes a gate electrode formed of a polycrystalline silicon.

When the complementary type MIS semiconductor integrated circuit described above and illustrated in FIG. 6 is fabricated, the P type semiconductor layer as well as the same conduction type regions 31 and 32 are formed simultaneously through an ion implantation or diffusion process. On the other hand, N type semiconductor layer 24 as well as same conduction type semiconductor regions 29 and 30 are also formed simultaneously through an ion implantation or diffusion technique. After the above semiconductor layers and regions have been formed, the sub-structure of MIS semiconductor integrated circuit is subjected to the treatments described hereinbefore in conjunction with FIGS. 3b to 3e.

As will be appreciated from the above description, the complementary type MIS semiconductor integrated circuit implementing the MIS semiconductor devices according to the invention can be easily and inexpensively accomplished without increasing the number of the manufacturing steps.

When a complementary MIS semiconductor integrated circuit device comprising a plurality of the complementary type MIS devices of the structure described above is to be fabricated, a plurality of P channel MOS's having different work function difference $\phi$MS (metal-semiconductor work function difference) can be obtained by providing masked portions and unmasked portions for the gate electrodes of the plural P channel MOS's upon forming the N+ type semiconductor layers (drain and source layers) 25 and 26. It is known that such work function difference $\phi$MS is a parameter for determining the threshold voltage (Vth) of the MOS circuit. Accordingly, it is possible to form the P channel MOS's having different threshold voltage Vth in a single semiconductor substrate of the complementary type MIS semiconductor integrated circuit device. On the other hand, when masked portions and unmasked portions are present for the gate electrodes of the plural N channel MOS's, then N channel MOS's having different threshold values Vth can be realized in a single semiconductor substrate in a similar manner as described above.

In the disclosed embodiments, it has been assumed that the teachings of the invention are applied to the silicon gate MIS type transistors. However, the invention is never restricted to such transistors but can be equally applied also to aluminium gate MIS type transistors.

I claim:

1. A method of manufacturing an MIS type semiconductor device, comprising steps of:
   (a) forming a thermally oxidized film on a surface of a semiconductor substrate of one conduction type;
   (b) forming a nitride film on said oxide film;
   (c) etching selectively said oxide film and nitride film to expose first and second surface portions of said surface spaced from each other;
   (d) introducing impurities of the other conduction type opposite to said one conduction type into said substrate through said exposed first and second surface portions to form first and second semiconductor regions spaced apart from each other by a predetermined distance;
   (e) thermally oxidizing the surfaces of said first and second semiconductor regions by using said oxide film and said nitride film as masking means to form first and second buried oxide films immediately above said first and second semiconductor regions, said buried oxide films having a thickness greater than that of said oxide film;
   (f) removing said nitride film;
   (g) forming a polycrystalline silicon layer on said semiconductor substrate between said first and second buried oxide films, said polycrystalline layer having peripheral portions extending over said first and second buried oxide films;
   (h) removing said oxide film in which said buried oxide films and said polycrystalline silicon layer are not located to expose third and fourth surface portions of said surface; and
   (i) introducing impurities of the other conduction type into said substrate through said exposed third and fourth surface portions to form third and fourth semiconductor regions of which parts are contacted with said first and second semiconductor region, respectively, said third and fourth semiconductor regions having a higher impurity concentration than that of said first and second semiconductor regions.

2. A method according to claim 1 comprising in succession to the step (d) steps of:
   (j) selectively removing said oxide film and said nitride film located outside of said first and second regions to expose a fifth surface portion of said surface; and
   (k) introducing impurities of said one condution type through said exposed fifth surface portion to form a fifth semiconductor region having a higher impurity concentration than that of said substrate to surround said third and fourth semiconductor regions.

3. A method according to claim 2, wherein at the step (e), the surface of said fifth semiconductor region is simultaneously and selectively oxidized to form a third buried oxide film having a thickness greater than that of said third oxide film.

4. A method according to claim 2, wherein said step (i) is carried out by using said first, second and third buried oxide films as masks.

5. A method according to claim 1, wherein said semiconductor substrate is composed of $N^-$ type silicon, said oxide film is of $SiO_2$ and said nitride film is of $Si_3N_4$.

6. A method according to claim 5, said step (e) is carried out in an atmosphere of mixed oxygen and nitrogen at 1000° C. for 6 to 7 hours.

7. A method according to claim 5, wherein said step (g) is carried out in an atmosphere of mixed nitrogen and silane ($SiH_4$) at 600° C.

8. A method according to claim 7, wherein said step (i) is conducted at 1050° C. for 30 minutes.

9. In a method of manufacturing an MIS type semiconductor device comprising the steps of:
   (a) forming a mask layer on a semiconductor substrate of one conductivity type, said mask having at least a first masking portion covering a first surface area of said semiconductor substrate and a second masking portion covering a second surface area of said substrate and spaced from said first surface area;
   (b) introducing impurities of another conductivity type opposite to said one conductivity type in other surface areas of said semiconductor substrate except locations where said first and second masking portions exist by using said mask layer;
   (c) subjecting the masked semiconductor substrate to an oxidizing atmosphere to form a first oxide portion at a portion of said semiconductor substrate exposed between said first and second masking portions, and a second oxide portion spaced from said first oxide portion by said second masking portion, whereby a first region doped by said impurities of said another conductivity type in said introducing step underlies said first oxide portion between said first and second masking portions and both end portions of said first region respectively terminate under said first and second masking portions; and
   (d) depositing a first conductive layer over an insulating layer on said first surface area to form a gate electrode, and depositing a second conductive layer on said second surface area to form an electrode for said first region, the improvement in said method comprising the steps of:
   (e) introducing impurities of said one conductivity type into at least a portion of area where said second oxide portion is to be formed, to form a second region for a channel stopper having a higher impurity concentration than that of said semiconductor substrate under at least a portion of the second oxide portion; and
   (f) introducing impurities of said another conductivity type into said second surface area by using at least a part of said first and second oxide portions as a masking layer to said impurities of said another conductivity type to form a third region in said semiconductor substrate for connecting said electrode for said first region thereto.

10. The method according to claim 9, wherein said impurities in said step for forming said channel stopper region are introduced by using said second masking portion as one end portion of a masking layer for defining said channel stopper region.

11. The method according to claim 9, wherein a width of said second surface area between said first and second oxide portions thereof is greater than a lateral width of said first region extending under said second masking portion.

12. The method according to claim 10, wherein a width of said second surface area between said first and second oxide portions thereof is greater than a total width of both lateral widths of said first and second regions extending under said second masking layer portion.

13. The method according to claim 12, wherein said electrode for said first region has a contact area contacted with a part of said third region except surface regions where said third region overlaps with said first and second regions.

14. The method according to claim 9, wherein said first and second region are relatively lightly doped in said steps (b) and (e), respectively, and said third region is relatively heavily doped in step (f).

15. The method according to claim 9, wherein a third oxide portion immediately above a fourth region of the other conductivity type is formed by said steps (b) and (c).

16. A method for fabricating a MIS type semiconductor device comprising the steps of:
(a) providing a semiconductor substrate of a first conductivity type;
(b) selectively forming a first masking portion on a first surface portion of said substrate, and a second masking portion on a second surface portion of said substrate spaced apart from said first surface portion;
(c) introducing impurities of a second conductivity type opposite to said first conductivity type with low impurity concentration into a third surface portion of said substrate exposed between said first and second masking portions by using said first and second masking portions so as to form a drain region at said third surface portion;
(d) selectively oxidizing said semiconductor substrate not covered by said first and second masking portions so as to form a first oxide portion between said first and second masking portions, and a second oxide portion spaced from said first oxide portion by said second masking portion;
(e) selectively introducing impurities of the second conductivity type with high impurity concentration into said second surface portion by using said first and second oxide portions as a mask so as to form a contact region; and
(f) applying a conductive layer on said contact region to form an electrode for said drain region.

17. The method according to claim 16, wherein the method further comprises the step of introducing impurities of said first conductivity type with low impurity concentration into a surface portion of said semiconductor substrate where said second oxide portion is to be formed prior to said step (d) of forming said second oxide layer portion, thereby to form a channel stopper region under said second oxide layer portion.

18. A method of manufacturing a complementary MIS type semiconductor integrated circuit device comprising steps of:
(a) forming a semiconductor substrate having a well region of one conductivity type extending to a major surface of said substrate, and a substrate region of the other conductivity type adjoining said well region and extending to said major surface;
(b) selectively introducing impurities of the one conductivity type simultaneously into said substrate region through a first area of the major surface of said substrate region and into said well region through a first area of the major surface of said well region to simultaneously form a first semiconductor region in said well region, said second semiconductor region having a higher concentration than that of said well region;
(c) selectively thermally oxidizing the first areas of said substrate region and well region to form first and second oxide portions at the first areas thereof, respectively;
(d) forming a first gate electrode for an MIS transistor of one conductivity type overlying a second area of said substrate region and a part of said first oxide portion; and
(e) forming a second gate electrode for an MIS transistor of the other conductivity type overlying a second area of said well region spaced from said first area thereof.

19. A method according to claim 18 further comprising the steps of
(f) selectively introducing the other conductivity type simultaneously into said well region through a part of the second area of said well region and into said substrate region through a third area of the major surface of said substrate region spaced from said first area thereof to simultaneously form a third semiconductor region in said well region and a fourth semiconductor region in said substrate region, said fourth semiconductor region having a higher concentration than that of said substrate region;
(g) selectively thermally oxidizing a part of the second area of said well region and the third area of said substrate region to form a third oxide portion at the part of the second area of said well region and a fourth oxide portion at the third area of said substrate region, respectively, in the step (c); and
(h) forming said second gate electrode overlying a part of said third oxide portion, in the step (e).

20. A method of manufacturing a complementary MIS type semiconductor integrated circuit device comprising steps of:
(a) forming a semiconductor substrate having a well region of one conductivity type extending to a major surface of said substrate, and a substrate region of the other conductivity type adjoining said well region and extending to said major surface;
(b) selectively introducing impurities of the other conductivity type simultaneously into said well region through a first area of the major surface of said well region and into said substrate region through a first area of the major surface of said substrate region to simultaneously form a first semiconductor region in said well region and a second semiconductor region in said substrate region, said second semiconductor region having a higher concentration than that of said substrate region;
(c) selectively thermally oxidizing the first areas of said well region and substrate region to form first and second oxide portions at the first areas thereof, respectively;
(d) forming a first gate electrode for an MIS transistor of one conductivity type overlying a second area of said well region and a part of said first oxide portion; and
(e) forming a second gate electrode for an MIS transistor of the other conductivity type overlying a second area of said substrate region spaced from said first area thereof.

* * * * *